United States Patent
Roy et al.

(10) Patent No.: US 11,430,797 B2
(45) Date of Patent: Aug. 30, 2022

(54) PACKAGE EMBEDDED PROGRAMMABLE RESISTOR FOR VOLTAGE DROOP MITIGATION

(71) Applicant: QUALCOMM Incorporated, San Diego, CA (US)

(72) Inventors: Abinash Roy, San Diego, CA (US); Bharani Chava, Cork City (IE)

(73) Assignee: QUALCOMM Incorporated, San Diego, CA (US)

( * ) Notice: Subject to any disclaimer, the term of this patent is extended or adjusted under 35 U.S.C. 154(b) by 91 days.

(21) Appl. No.: 16/917,212

(22) Filed: Jun. 30, 2020

(65) Prior Publication Data
US 2021/0408015 A1    Dec. 30, 2021

(51) Int. Cl.
*H01L 27/112* (2006.01)
*H01L 23/538* (2006.01)
*H01L 21/48* (2006.01)

(52) U.S. Cl.
CPC .... *H01L 27/11206* (2013.01); *H01L 21/4853* (2013.01); *H01L 21/4857* (2013.01); *H01L 23/5383* (2013.01); *H01L 23/5386* (2013.01)

(58) Field of Classification Search
CPC ........ H01L 27/10805; H01L 27/10811; H01L 27/10814; H01L 27/1082; H01L 27/10847; H01L 27/1085–10867; H01L 2924/1205; H01L 2924/19041; H01L 28/40–92; H01L 23/498–49894; H01L 23/538–5389; H01L 23/3128; H01L 21/4846–4867; H01L 21/4807–481; H01L 23/12–15; H01L 23/3114; H01L 23/32; H01L 23/3121; H01L 21/4885; H01L 23/49811
See application file for complete search history.

(56) References Cited

U.S. PATENT DOCUMENTS

| | | | |
|---|---|---|---|
| 7,019,584 B2 | 3/2006 | Bartel et al. | |
| 7,052,941 B2 | 5/2006 | Lee | |
| 7,339,357 B2 | 3/2008 | Lopata | |
| 7,698,677 B2 | 4/2010 | Zhao et al. | |
| 9,129,935 B1 | 9/2015 | Chandrasekar et al. | |
| 9,377,802 B1* | 6/2016 | Wyland | G05F 1/652 |
| 9,634,645 B2* | 4/2017 | Lan | H01L 23/66 |
| 2014/0266494 A1* | 9/2014 | Lan | H01L 27/1259 333/32 |
| 2014/0268615 A1* | 9/2014 | Yun | H05K 3/10 361/782 |
| 2017/0111032 A1* | 4/2017 | Liao | H01L 23/642 |
| 2019/0393051 A1* | 12/2019 | Kawano | H01L 23/60 |

OTHER PUBLICATIONS

Kim et al, "Package Embedded Decoupling Capacitor Impacton Core Power Delivery Network for ARM SoC Application", 2014 IEEE Electronic Components & Technology Conference, pp. 354-359 (Year: 2014).*

* cited by examiner

*Primary Examiner* — Selim U Ahmed
*Assistant Examiner* — Evan G Clinton
(74) *Attorney, Agent, or Firm* — Muncy, Geissler, Olds & Lowe, P.C./Qualcomm

(57) ABSTRACT

Disclosed are devices and methods having a programmable resistor and an on-package decoupling capacitor (OPD). In one aspect a package includes an OPD and a programmable resistor formed from at least one thin-film transistor (TFT). The programmable resistor is disposed in series with the OPD between a supply voltage (VDD) conductor and a ground conductor.

28 Claims, 11 Drawing Sheets

PACKAGE EMBEDDED PROGRAMMABLE RESISTOR FOR VOLTAGE DROOP MITIGATION

FIELD OF DISCLOSURE

This disclosure relates generally to devices having a power distribution network (PDN) and more specifically to addressing voltage droop therein.

BACKGROUND

Integrated circuit technology has achieved great strides in advancing computing power through miniaturization of active components and passive components. The active and passive devices may be located on one or more components in an integrated device, which may include multiple components in a PDN, such as, a power source (e.g., a power management integrated circuit (PMIC), voltage regulator module, etc., referred herein generally as a PMIC), printed circuit board (PCB), package and/or die.

Excessive voltage droop higher than an allocated noise budget in a power distribution network (PDN) may cause timing failures as well as reliability issues to the functional blocks to which the PDN delivers power. Voltage droop is proportional to the impedance of the PDN. Therefore, it is generally desired to reduce this impedance. Using an on-package decoupling capacitor (OPD) is one of the ways to reduce the impedance, especially at the mid-frequencies of the impedance profile where resonant peaks (maximum impedance) occur. Standard cells in a timing-critical path typically have higher jitter sensitivity to droop noise in these mid-frequencies. The addition of an OPD improves the impedance peaks for a given design by reducing the bump loop inductance for which charge from OPD propagates faster to load current and adding additional resistance (improving dampening) in the resonant current loop. Therefore, smaller effective inductance of the OPD (caps internal inductance, also known as, effective series inductance (ESL)+mounting package inductance) and an effective series resistance (ESR) are design targets.

In order to achieve smaller effective inductance, OPDs with extremely low ESL are widely used. Examples of OPDs with extremely low ESL include reverse geometry multilayer ceramic cap (MLCC), multi-terminals (3T, 16T, etc.), integrated passive device (IPD), and the like. However, these OPDs with extremely low ESL come at the expense of extremely low ESR as well, which degrades the impedance peaks at the resonance frequencies. If the load current contains significant energy at these resonance frequencies, very large droop can occur, which can result in poor performance and/or catastrophic failures in an integrated circuit.

Accordingly, there is a need for systems, apparatus, and methods that overcome the deficiencies and/or improve performance of conventional approaches including the methods, system and apparatus provided herein.

SUMMARY

The following presents a simplified summary relating to one or more aspects and/or examples associated with the apparatus and methods disclosed herein. As such, the following summary should not be considered an extensive overview relating to all contemplated aspects and/or examples, nor should the following summary be regarded to identify key or critical elements relating to all contemplated aspects and/or examples or to delineate the scope associated with any particular aspect and/or example. Accordingly, the following summary has the sole purpose to present certain concepts relating to one or more aspects relating to the apparatus and methods disclosed herein in a simplified form to precede the detailed description presented below.

At least one aspect includes a package including: an on-package decoupling capacitor (OPD); and a programmable resistor formed from at least one thin-film transistor (TFT), where the programmable resistor is disposed in series with the OPD between a supply voltage (VDD) conductor and a ground conductor.

At least one aspect includes an integrated device including: a die and a package coupled to the die, where the package includes: an on-package decoupling capacitor (OPD); and a programmable resistor formed from at least one thin-film transistor (TFT), where the programmable resistor is disposed in series with the OPD between a supply voltage (VDD) conductor and a ground conductor.

At least one aspect includes a method for manufacturing a package, the method including: forming an on-package decoupling capacitor (OPD); and forming a programmable resistor from at least one thin-film transistor (TFT), where the programmable resistor is disposed in series with the OPD between a supply voltage (VDD) conductor and a ground conductor.

Other features and advantages associated with the apparatus and methods disclosed herein will be apparent to those skilled in the art based on the accompanying drawings and detailed description.

BRIEF DESCRIPTION OF THE DRAWINGS

A more complete appreciation of aspects of the disclosure and many of the attendant advantages thereof will be readily obtained as the same becomes better understood by reference to the following detailed description when considered in connection with the accompanying drawings which are presented solely for illustration and not limitation of the disclosure.

Figure 1:
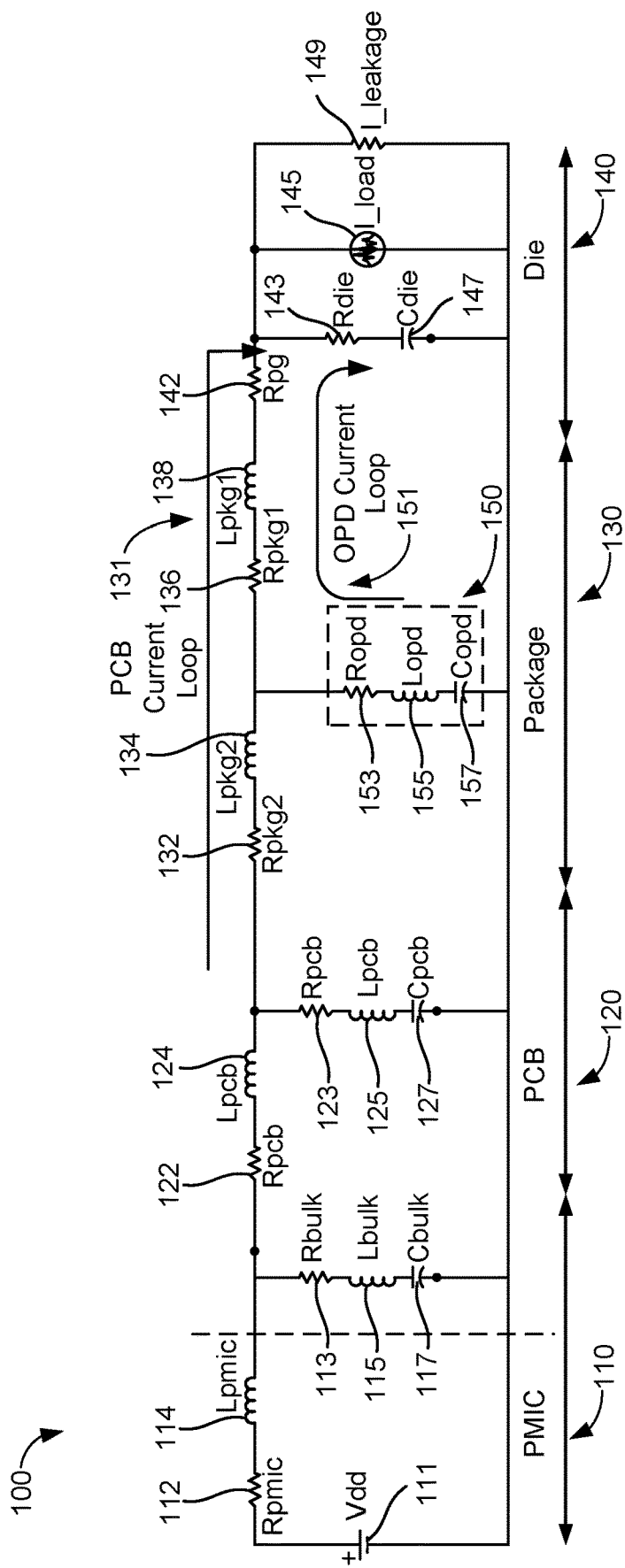
FIG. 1 illustrates an exemplary schematic of a conventional power distribution network (PDN).

In accordance with common practice, the features depicted by the drawings may not be drawn to scale. Accordingly, the dimensions of the depicted features may be arbitrarily expanded or reduced for clarity. In accordance with common practice, some of the drawings are simplified for clarity. Thus, the drawings may not depict all components of a particular apparatus or method. Further, like reference numerals denote like features throughout the specification and figures.

DETAILED DESCRIPTION

Aspects of the present disclosure are illustrated in the following description and related drawings directed to specific embodiments. Alternate aspects or embodiments may be devised without departing from the scope of the teachings herein. Additionally, well-known elements of the illustrative embodiments herein may not be described in detail or may be omitted so as not to obscure the relevant details of the teachings in the present disclosure.

In certain described example implementations, instances are identified where various component structures and portions of operations can be taken from known, conventional techniques, and then arranged in accordance with one or more exemplary aspects. In such instances, internal details of the known, conventional component structures and/or portions of operations may be omitted to help avoid potential obfuscation of the concepts illustrated in the illustrative embodiments disclosed herein.

The terminology used herein is for the purpose of describing particular aspects for illustration and explanation only and is not intended to be limiting. As used herein, the singular forms "a," "an," and "the" are intended to include the plural forms as well, unless the context clearly indicates otherwise. It will be further understood that the terms "comprises," "comprising," "includes," and/or "including," when used herein, specify the presence of stated features, integers, steps, operations, elements, and/or components, but do not preclude the presence or addition of one or more other features, integers, steps, operations, elements, components, and/or groups thereof.

The various aspects proposed include the implementation of a programmable resistor using thin-film transistor (TFT) in the OPD mounting path. In some aspects, the programmable resistor and the OPD are located in the bottom-most layer of a package. In some aspects of the disclosure, in addition to the benefit of the additional resistance in the OPD mounting path, the option for programmability of the resistor (also referred to as a tunable, programmable, variable, and/or adjustable resistor) can be used to optimize the ESR in a given PDN. It will be appreciated that even for similar designs, due to material and process variations, programmable resistors may be set to different values for the PDNs in similar devices.

The TFT for the programmable resistor can be implemented in wafer-level packages such as an integrated fan-out (InFO) wafer-level package. In some example aspects, a cluster of P-Metal-Oxide-Semiconductor (PMOS) thin-film transistors (TFTs) are added in parallel between the supply voltage (VDD) pad of an OPD and the VDD ball grid array (BGA) pins as well as metal shapes (traces, patterns, etc. in a metal layer) in the package. The source terminals of the PMOS TFTs are coupled to the VDD BGA pins/pads/balls directly or to metal shapes coupled to the VDD BGA pins, and drain terminals are coupled to the OPD VDD pad. The PMOS gate terminal, which modulates channel resistance (OPD mounting resistance), is controlled by a second power supply signal from the PMIC. Package connections to the upper layers from BGA pins of the package, metal shapes/traces in the various metal layers and interlayer couplings made through vias and unaffected by addition of these transistors, i.e., the internal configuration and connections of the package are independent of this addition. Accordingly, a very low mounting inductance as well as high series resistance (ESR) of the OPD can be achieved.

FIG. 1 illustrates an exemplary schematic of a conventional PDN. As shown in FIG. 1, the integrated device PDN 100 may include one or more components such as a power management integrated circuit (PMIC) 110, printed circuit board (PCB) 120, package 130 and die 140. The components PMIC 110, PCB 120, package 130 and die 140 may be represented schematically as a network of resistors (R), inductors (L) and capacitors (C) for purposes of modeling the PDN 100. As illustrated, the PMIC 110 may have a power supply VDD 111, a series resistance 112 and inductance 114. Bulk resistance 113, inductance 115 and capacitance 117 are electrical representatives of a low frequency capacitor between VDD and ground in the PCB 120. The PCB 120 also has a series resistance 122 and inductance 124. The PCB 120 also has a parallel impedance path having a resistance 123, inductance 125 and capacitance 127 that are electrical representatives of a high frequency capacitor between VDD and ground in the PCB 120. The package 130 also has a first series resistance 132 and a first series inductance 134 and a second series resistance 136 and a second series inductance 138. The package 130 also includes an OPD 150 as discussed above. The OPD 150 is part of a parallel impedance path having a resistance 153, inductance 155 and capacitance 157 that are electrical representatives of a package capacitor between VDD and ground in the package 130. The die 140 has a bump resistance 142 and parallel impedance path having a die resistance 143 and die capacitance 147 that are electrical representatives of an on-die capacitor between VDD and ground in the die 140. The PDN 100 terminates at the die 140 having a load 145 and a leakage resistance 149 associated with the load 145.

As will be appreciated from the illustration of PDN 100, each of the components in the PDN 100 along the power supply (VDD) rail can be modeled as series resistances and inductances along with leakage paths between VDD and ground that can be modeled as a parallel path of resistances, inductances and capacitances. As noted above, the OPD 150 is used to improve the impedance characteristics of the PDN 100. Also, as illustrated, there can be multiple current loops within the PDN 100. Specifically, the PCB current loop 131 includes the first series resistance 132 and first series inductance 134 and the second series resistance 136 and second series inductance 138 of the package 130. The PCB current loop 131 also includes the bump resistance 142, die resistance 143 and die capacitance 147 of the die 140. In contrast the OPD current loop 151 does not include the first series resistance 132 and first series inductance 134 of the package 130. Further, it will be appreciated that as discussed above increasing the resistance will help to dampen the frequency response at the resonant frequencies. However, adding additional resistance in series with the power supply path 111 would increase voltage droop and reduce power supply efficiency.

Figure 2:
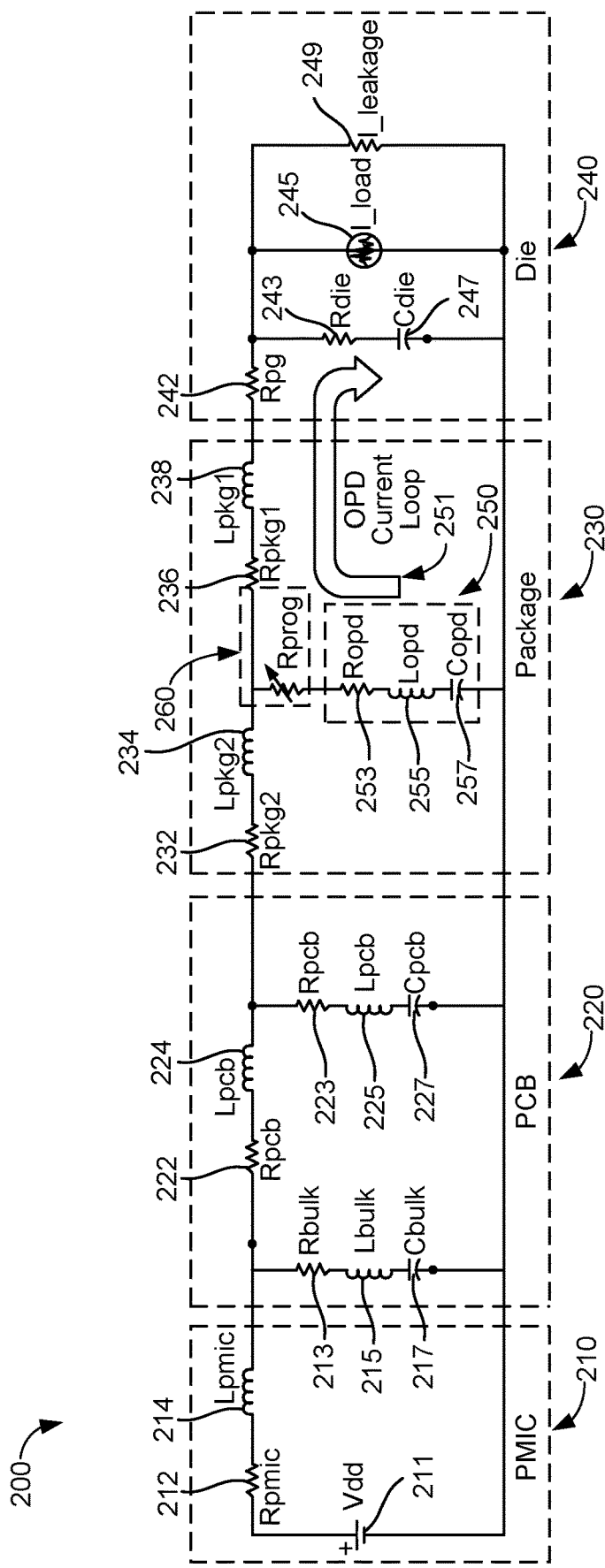
FIG. 2 illustrates an exemplary schematic of a power distribution network (PDN) in accordance with some examples of the disclosure.

FIG. 2 illustrates an exemplary schematic of a PDN in accordance with some examples of the disclosure. As shown in FIG. 2, the integrated device PDN 200 may include one or more components such as a power management integrated circuit (PMIC) 210, printed circuit board (PCB) 220, package 230 and die 240. The components PMIC 210, PCB 220, package 230 and die 240 may be represented schematically as a network of resistors (R), inductors (L) and capacitors (C) for purposes of modeling the PDN 200. As illustrated, the PMIC 210 has a power supply VDD 211, a series resistance 212 and inductance 214. Bulk resistance 213, inductance 215 and capacitance 217 are representative of a low frequency PCB capacitor between VDD and ground. The PCB 220 also has a series resistance 222 and inductance 224. The PCB 220 also has a parallel impedance path having a resistance 223, inductance 225 and capacitance 227 that are representative of a high frequency capacitor between VDD and ground in the PCB 220. The package 230 also has a first series resistance 232 and a first series inductance 234 and a second series resistance 236 and a second series inductance 238. The package 230 also includes an OPD 250 as discussed above. The OPD 250 is part of a parallel impedance path having a resistance 253, inductance 255 and capacitance 257 that are representative of a capacitor between VDD and ground in the package 230. The die 240 has a bump resistance 242 and parallel impedance path having a die resistance 243 and die capacitance 247 that are representative of a die capacitor between VDD and ground in the die 240. It will be appreciated that although the die 240 also has inductance, it is extremely small so it can be ignored. The PDN 200 terminates at the die 240 having a load 245 and a leakage resistance 249 associated with the load 245.

As will be appreciated from the illustration of PDN 200, each of the components in the PDN 200 in the power supply path (VDD rail) can be modeled as series resistances and inductances along with leakage paths between VDD and ground modeled as parallel paths having resistances, inductances and/or capacitances. As noted above, the OPD 250 is used to improve the impedance characteristics of the PDN 200. However, in contrast to the conventional systems, the OPD current loop 251 includes a programmable resistor 260 in series with the OPD 250, which provides additional resistance in the OPD current loop 251. It will be appreciated that the programmable resistor 260 does not impact the series resistance in the power supply path and will not increase voltage droop or reduce power supply efficiency. As discussed in the foregoing, the programmable resistor 260 can be used to adjust the ESR of the PDN 200 and allow for the impedance to be set to a value that provides improved performance of the PDN 200.

Figure 3:
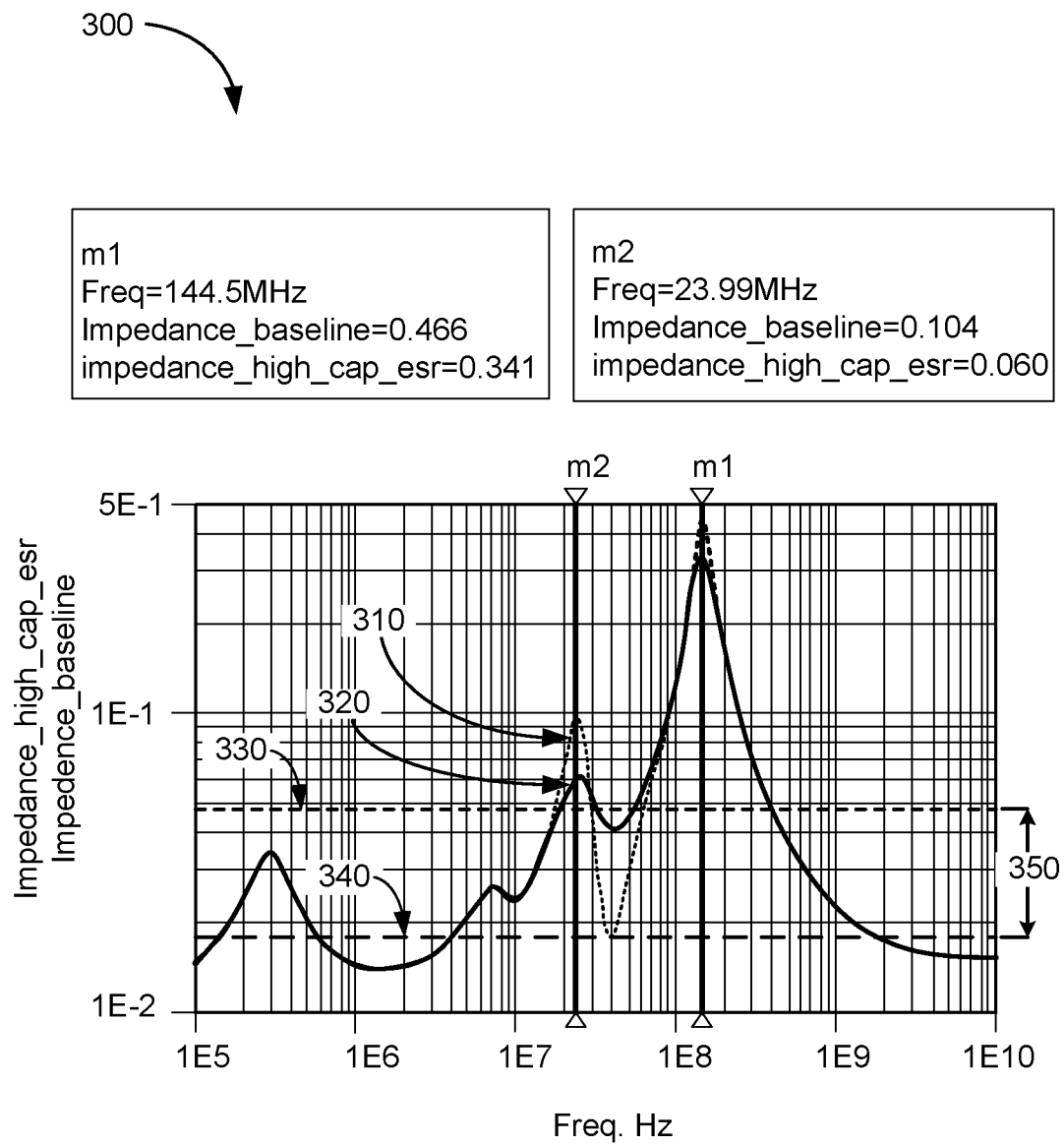
FIG. 3 illustrates a graph of impedance at various frequencies for the conventional PDN and the PDN including a programmable resistor in accordance with some examples of the disclosure.

FIG. 3 illustrates a graph 300 comparing impedance at various frequencies of the conventional PDN (e.g., PDN 100) with the PDN (e.g., PDN 200) including a programmable resistor in accordance with some examples of the disclosure. As shown in FIG. 3, the impedance profile 310 of the conventional PDN is illustrated in comparison with the impedance profile 320 of the PDN including a programmable resistor. Two resonant peaks are illustrated at m1 having a frequency of 144.5 MHz and at m2 having a frequency of 23.99 MHz. The impedance peaks at resonance frequencies m1 and m2 are significantly degraded for the impedance profile 310 of the conventional system when compared with the impedance profile 320 of systems in accordance with the various aspects disclosed herein. It will be appreciated that voltage droop is proportional to the impedance of the PDN. The voltage droop can be significantly improved using various aspects disclosed herein. It will be appreciated that the resistance value and ranges of the programmable resistor may be determined for a given PDN. For example, each PDN may have a target impedance target 330, $Z_{target}$ (e.g., a maximum impedance spec). A total resistance in the OPD path (internal resistance of the OPD 340 ($R_{opd}$)+Programmable resistance ($R_{prog}$)) should not be larger than the target impedance. Accordingly, in some aspects of the disclosure, the resistance value of the programmable resistor can be determined as, $R_{prog}=Z_{target}-R_{opd}$. It will be appreciated that both the $Z_{target}$ 330 and $R_{opd}$ 340 are known for a given PDN. Therefore, the value for $R_{prog}$ can be programmed through a software and/or hardware process using the various aspects disclosed herein. Further, a range 350 of resistance values, can be determined from $Z_{target}$ 330 and $R_{opd}$ 340. Specifically, in some aspects, the range 350 of resistance values the range can be determined as $R_{opd} \leq R_{prog} \leq Z_{target}$. Example values of the resistance ($R_{prog}$) are in the range of 5 mΩ to 50 mΩ for high-performance computer applications (e.g., wireless devices, laptop, desktop computers, IoT devices, etc.). It will be appreciated that the illustrated configuration, descriptions and sample values are provided merely to aid in the explanation of the various aspects disclosed herein. Accordingly, the forgoing illustrative examples and associated figures should not be construed to limit the various aspects disclosed and claimed herein.

Figure 4:
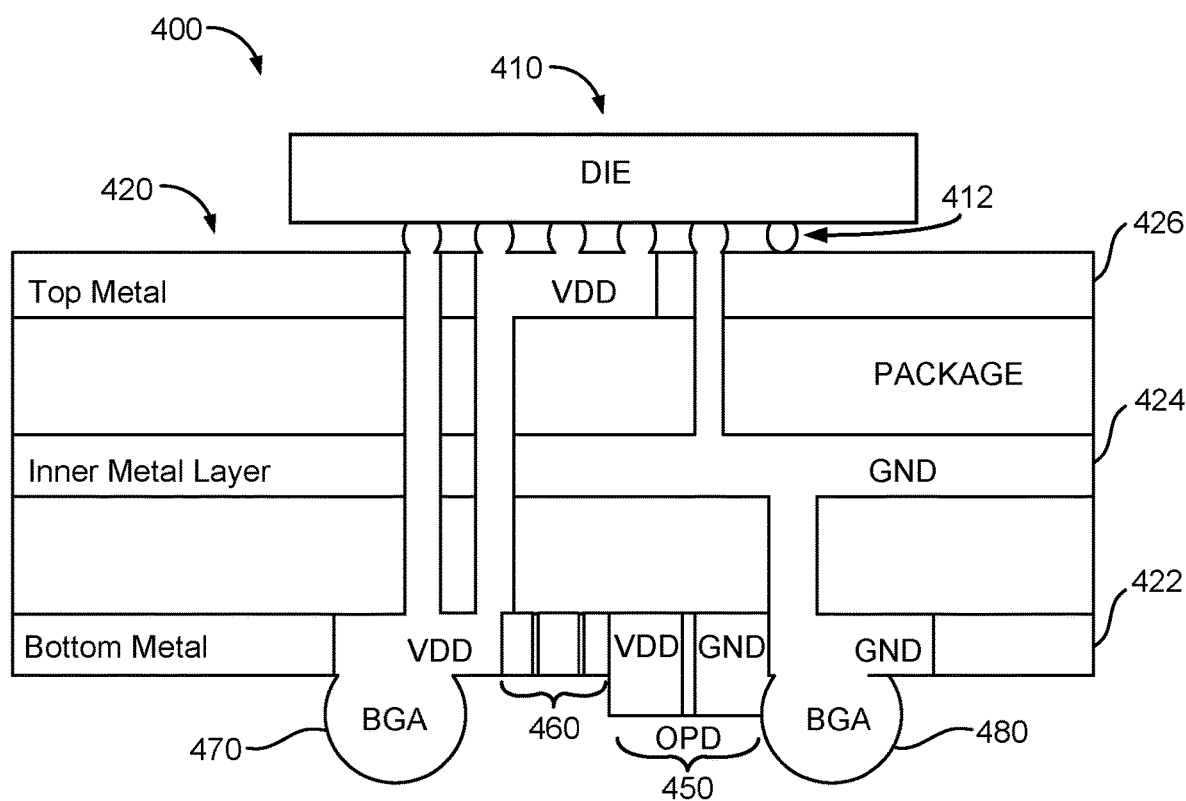
FIG. 4 illustrates an exemplary partial cross-sectional view of a package and die in accordance with some examples of the disclosure.

FIG. 4 illustrates an exemplary partial cross-sectional view of a package and die in accordance with some examples of the disclosure. As shown in FIG. 4, an integrated device 400 may include a die 410 coupled via die bumps 412 to package 420. The die bumps 412 can be used to provide power, VDD and ground (GND), connections to the die 410 from the package 420. Also, the die bumps 412 can be used for digital inputs/outputs and/or analog inputs/outputs coupled to the package 420 for distribution to a PCB (not illustrated) or other component coupled to the package 420. Further as illustrated, the package 420 may have a plurality of metal layers including a bottom metal layer 422, an inner metal layer 424 and a top metal layer 426. It will be appreciated that more or less metal layers may be provided in the package 420 according to the design considerations when laying out the package 420 (e.g., number of connections, routing strategies, etc.) and the various aspects disclosed are not limited to the illustrated design. A VDD BGA pin 470 of a BGA may be coupled to a power source VDD and a GND BGA pin 480 may be coupled to ground. Note as used herein the term BGA pin is not intended to limit the BGA connection to any specific type and the term BGA pin can include a solder ball or any other suitable connector to couple the package to a PCB or other component. In various aspects, the VDD and ground sources may be from a PCB (not illustrated) and may ultimately be supplied from a PMIC (also not illustrated), as discussed herein. The power source from VDD BGA pin 470 and GND BGA pin 480 may be distributed in the package 420 using a variety of traces (metal shapes, patterns, etc.) and vias to distribute the power to the die bumps 412, as illustrated. It will be appreciated that the illustrated configuration is provided merely to aid in explanation and is not intended to limit the various aspects disclosed herein.

According to the various aspects disclosed herein, between the VDD BGA pin 470 and the GND BGA pin 480, an OPD 450 and programmable resistor 460 may be formed in the bottom metal layer 422. The programmable resistor 460 may be formed from thin-film transistors (TFTs) in wafer-level packages such as integrated fan-out (InFO)

packages, which can use a similar chip process and manufacturing technology. As illustrated, in package 420, the various connections to the upper layers (e.g., 426) from the BGA pins (470, 480) and lower metal layers (e.g., 422 and 424) are made through vias and remain unaffected by the addition of the programmable resistor 460 and OPD 450.

Figure 5A:
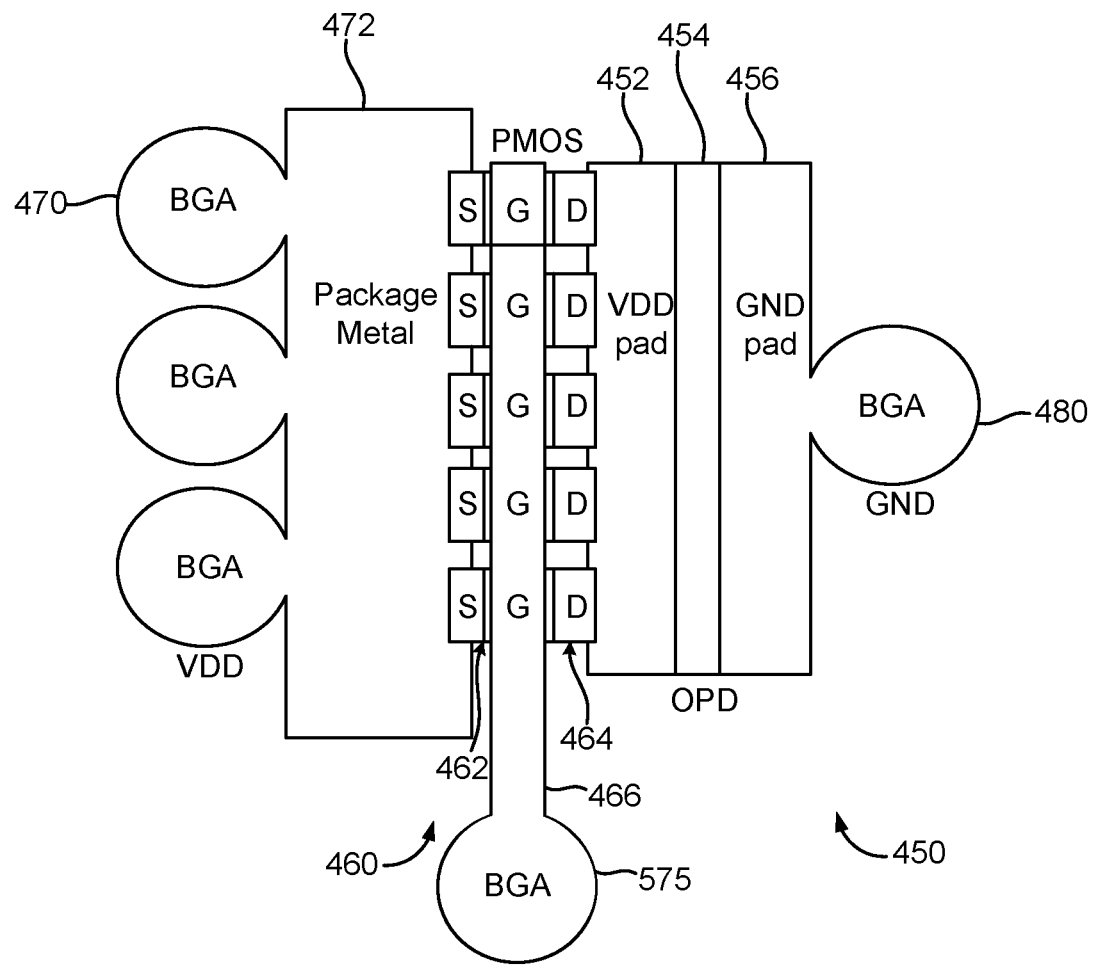
FIG. 5A illustrates an exemplary top view of a portion of a package in accordance with some examples of the disclosure.

FIG. 5A illustrates an exemplary top view of a portion of a package in accordance with some examples of the disclosure. As shown in FIG. 5A, in some aspects of the disclosure, the programmable resistor 460 may be formed as a cluster of thin-film PMOS transistors 460 in the bottom metal layer between the VDD pad 452 of the OPD 450 and VDD BGA pins 470. A metal shape 472, in some aspects, is formed in the bottom metal layer to couple the VDD BGA pin 470 to the PMOS transistors 460. Specifically, the source terminals (S) 462 of the PMOS transistors 460 are coupled to the VDD BGA pin 470 via metal shape 472. The drain terminals (D) 464 of the PMOS transistors 460 are coupled to the VDD pad 452 of OPD 450. The PMOS transistors 460 each have a gate (G) coupled to a common gate terminal 466, which modulates channel resistance (OPD mounting resistance). In some aspects, a gate power signal may be provided to the common gate terminal 466 by the PMIC (not illustrated) via BGA pin 575 to control the channel resistance, which allows for the programming of the programmable resistor 460. The OPD 450 further includes one or more dielectric layers 454 between the VDD pad 452 and a GND pad 456. The GND pad 456 is coupled to the GND BGA pin 480. In some aspects, the one or more dielectric layers 454 for OPD 450 can be a composite of neodymium, samarium and other rare earth oxides (e.g., NP0). It will also be appreciated that ferro-dielectric materials can be used to provide increased capacitance density. The GND pad 456 material can be copper, nickel, aluminum, etc. It will be appreciated that the illustrated and discussed configurations, materials and descriptions are provided merely to aid in the explanation of the various aspects disclosed herein. Accordingly, the forgoing illustrative examples and associated figures should not be construed to limit the various aspects disclosed and claimed herein.

For example, in other aspects, the arrangement of the OPD 450 and programmable resistor 460 may be reversed such that the programmable resistor 460 is coupled between the ground (GND) pad 456 of the OPD 450 and one or more GND BGA pins 480. The OPD 450 may be formed such that the VDD pad 452 is coupled to one or more VDD BGA pins 470. Various metal shapes may be formed to facilitate the coupling of programmable resistor 460 to the one or more GND BGA pins 480 and/or the OPD 450 to the one or more VDD BGA pins 470.

Figure 5B:
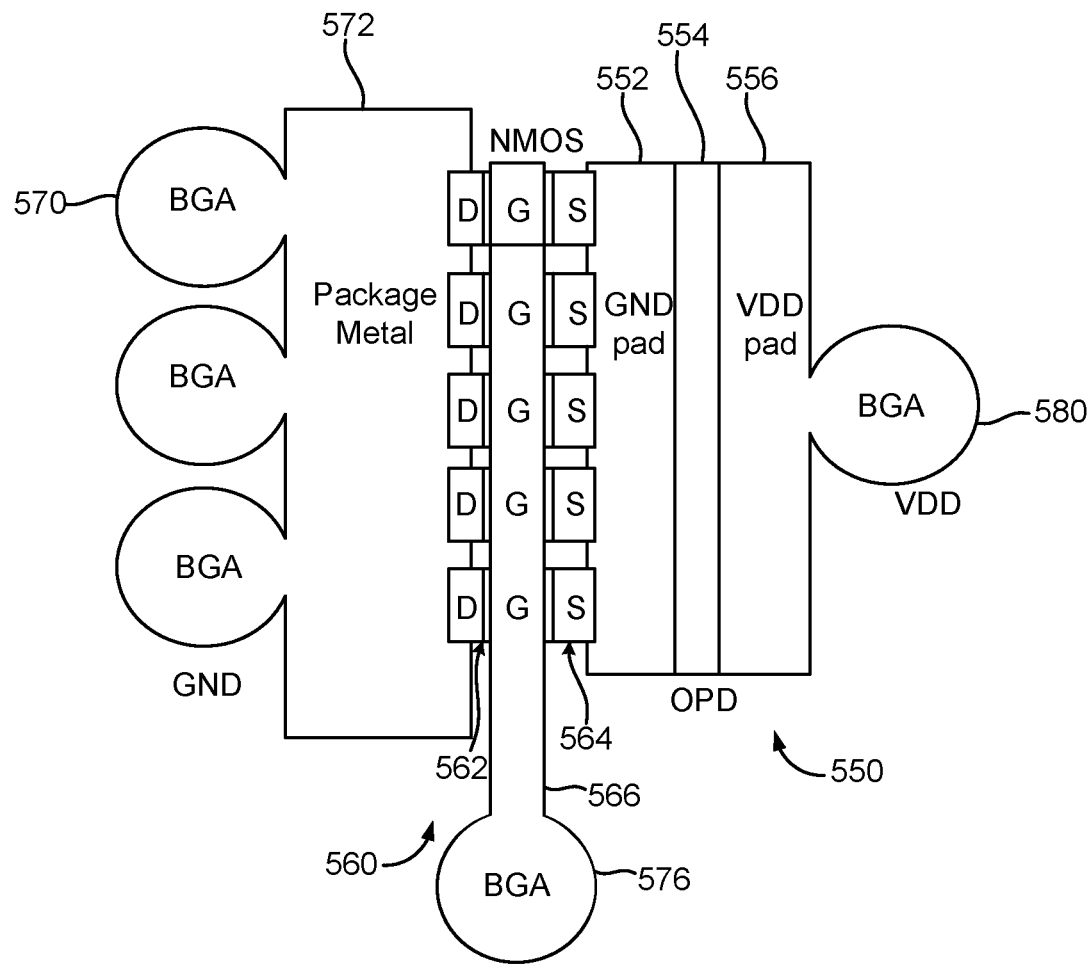
FIG. 5B illustrates an exemplary top view of a portion of a package in accordance with some examples of the disclosure.

For example, as illustrated in FIG. 5B, in some additional aspects, the programmable resistor 560 may be formed as a cluster of thin-film NMOS transistors 560 in the bottom metal layer. The arrangement of the OPD 550 and programmable transistor 560 may be reversed from the foregoing illustration such that the programmable resistor 560 is coupled between the GND pad 552 of the OPD 550 and one or more GND BGA pins 570, via metal shape 572, in some aspects. The OPD 550 may be formed such that the VDD pad 556 is coupled to one or more VDD BGA pins 580. Various metal shapes may be formed to facilitate the coupling of programmable resistor 560 to the one or more GND BGA pins 570 and/or the OPD 550 to the one or more VDD BGA pins 580. The metal shape 572, in some aspects, is formed in the bottom metal to couple the GND BGA pins 570 to the NMOS transistors 560. Specifically, the drain terminals (D) 562 of the NMOS transistors 560 are coupled to the GND BGA pins 570 via the metal shape 572. The source terminals (S) 564 of the NMOS transistors 560 are coupled to the GND pad 552 of the OPD 550. The NMOS transistors 560 each have a gate (G) coupled to a common gate terminal 566, which modulates channel resistance (OPD mounting resistance). In some aspects, a gate power signal may be provided to the common gate terminal 566 by the PMIC (not illustrated) via BGA pin 576 to control the channel resistance, which allows for the programming of the programmable resistor 560. The OPD 550 further includes one or more dielectric layers 554 between the VDD pad 556 and the GND pad 552. It will be appreciated that the illustrated configuration and descriptions are provided merely to aid in the explanation of the various aspects disclosed herein. Accordingly, the forgoing illustrative examples and associated figures should not be construed to limit the various aspects disclosed and claimed herein.

Figure 5C:
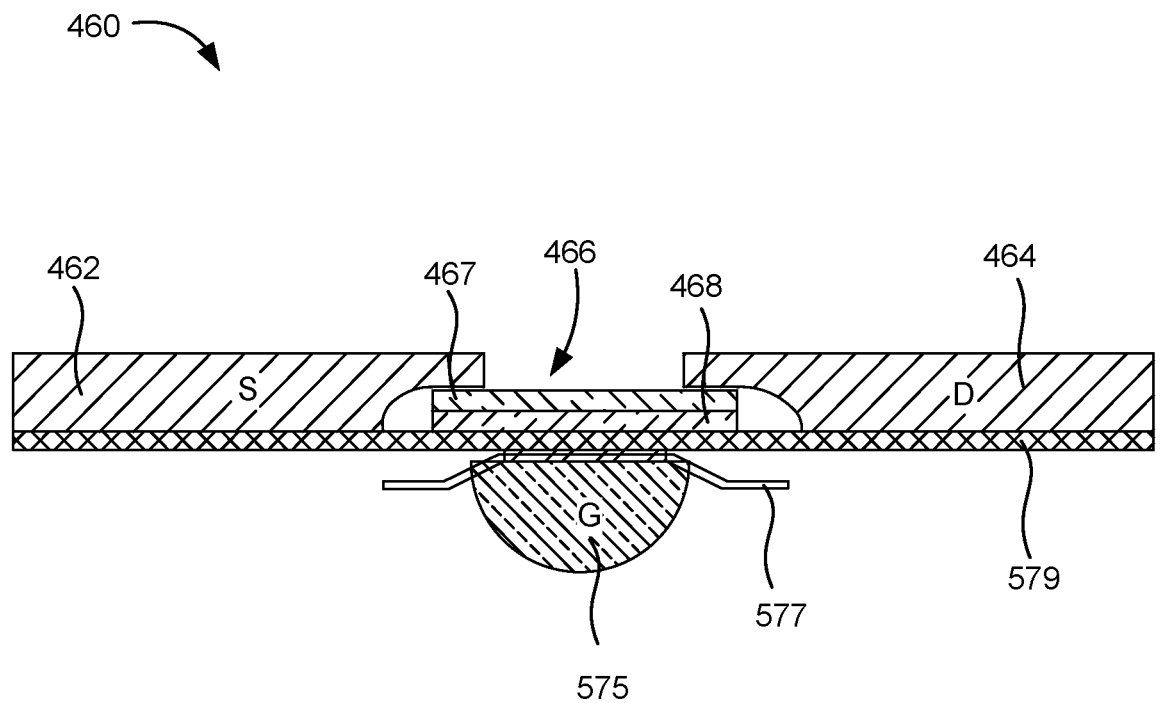
FIG. 5C illustrates an exemplary cross-sectional view of a portion of a programmable resistor in accordance with some examples of the disclosure.

FIG. 5C illustrates an exemplary cross-sectional view of a portion of a programmable resistor 460 in accordance with some examples of the disclosure. As shown in FIG. 5C, in some aspects of the disclosure, the programmable resistor 460 may be formed as a thin-film transistor (TFT). The source terminal (S) 462 of the TFT 460 is coupled to the common gate terminal 466. The drain terminal (D) 464 and source terminal (S) 462 may be formed of any metal, such as aluminum (AL) that may be used in the bottom metal layer, as discussed above. Alternatively, the drain terminal (D) 464 and source terminal (S) 462 may be formed of an alloy that has a higher melting point than AL. The common gate terminal 466 may include a channel material 467 and a gate dielectric 468, as is known in the art. The channel material 467 may be formed from a low temperature budget thin film material, such as indium gallium zinc oxide (IGZO). The gate dielectric 468 may be formed from an aluminum oxide ($AL_2O_3$) material. The common gate terminal 466, drain terminal (D) 464 and source terminal (S) 462 may be in contact with an interlayer dielectric 579, which may be formed from a silicon dioxide ($SiO_2$) material. As noted above, in some aspects, a gate power signal may be provided to the common gate terminal 466 via BGA pin 575 to control the channel resistance, which allows for the programming of the programmable resistor 460. The BGA pin 575 may be formed on a under bump metallization (UBM) 577. It will be appreciated that the illustrated configuration, materials and descriptions are provided merely to aid in the explanation of the various aspects disclosed herein. Although only one TFT 460 is illustrated for ease of explanation, it will be appreciated that a plurality of TFTs 460 can be fabricated in a similar manner and, in some configurations, may share a common gate terminal 466, as discussed in the foregoing. Accordingly, the forgoing illustrative examples and associated figures should not be construed to limit the various aspects disclosed and claimed herein.

Figure 5D:
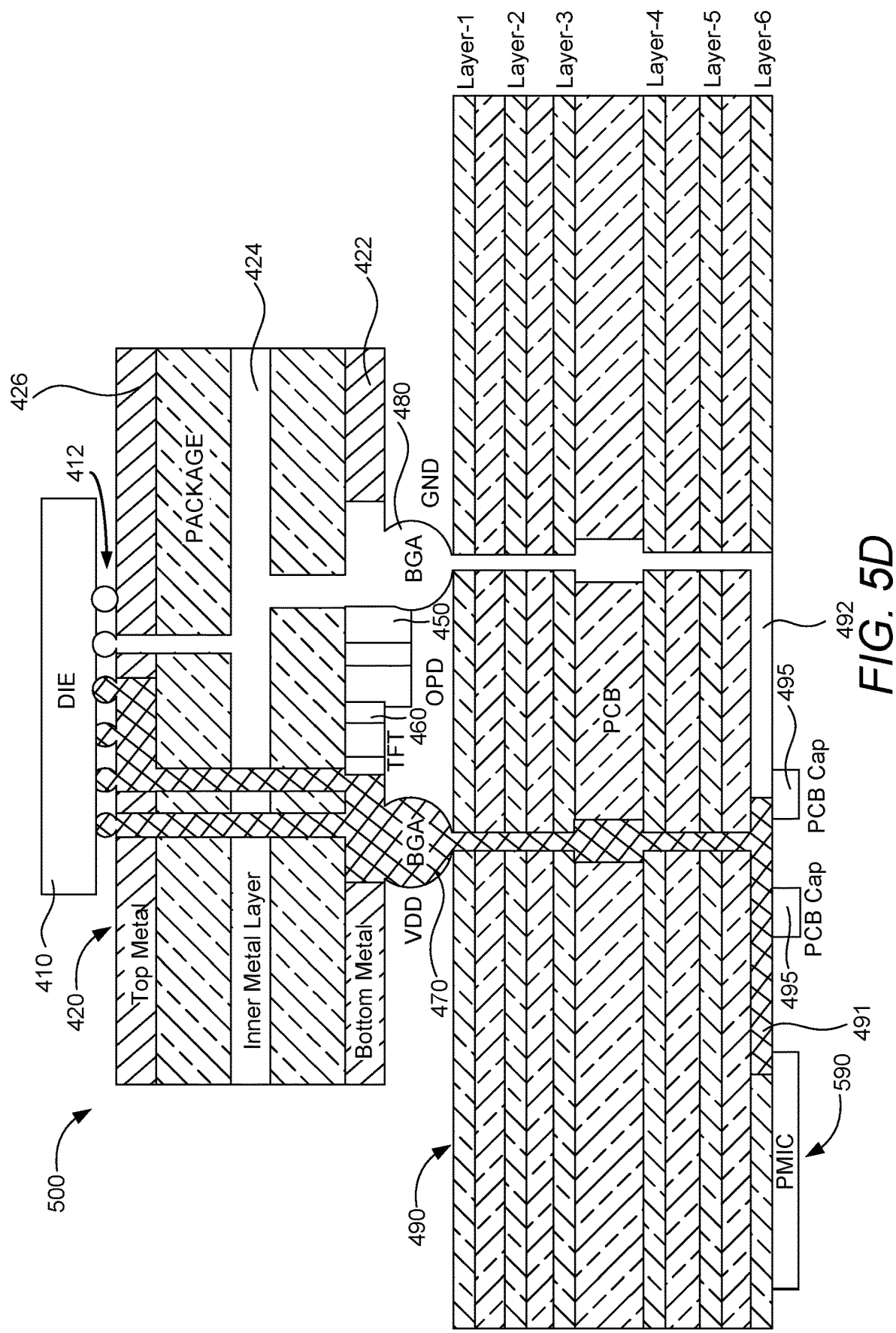
FIG. 5D illustrates components of a power distribution network (PDN) in accordance with some examples of the disclosure.

FIG. 5D illustrated components of a PDN 500 according to various aspects of the disclosure. Regardless of the various configurations of the packages discussed above, it will be appreciated that the package 420 may be configured to couple the die 410 to a PCB 490. The PCB 490 is also coupled to a PMIC 590, which allows the package 420 and the die 410 to be electrically coupled to the PMIC 590. Specifically, one or more power supply (VDD) lines 491 and one or more ground (GND) lines 492 may be coupled to the PMIC 590 to distribute power to the PCB 490, package 420 via VDD BGA pin 470 and GND BGA pin 480 and to the die 410 via die bumps 412. The VDD line 491 and GND line 492 each may be formed from traces, shapes or patterns in one or more metal layers of the PCB 490 (e.g., layers 1-6) coupled by one or more vias through insulating layers separating the metal layers 1-6 in the PCB 490. The PCB 490 may have one or more PCB capacitors (PCB cap) 495 that can be used to condition the power supply signals, as is known to those skilled in the art. As discussed above, the PMIC 590 may also provide a signal through a line in the PCB 490 and BGA pin (not illustrated) on the package 420 to control the resistance of programmable resistor 460. By controlling the resistance of the programmable resistor 460, along with the OPD 450, tuning of the PDN network to improve voltage droop can be achieved, as discussed above. It will be appreciated that the illustrated configuration and descriptions are provided merely to aid in the explanation of the various aspects disclosed herein. For example, the PCB 490 may have more or less metal and insulating layers, there may be multiple lines providing power to the various components, etc. Accordingly, the forgoing illustrative examples and associated figures should not be construed to limit the various aspects disclosed and claimed herein.

In accordance with the various aspects disclosed herein, at least one aspect includes a package (e.g., package 420) having an on-package decoupling capacitor (OPD) (e.g., OPD 450). A programmable resistor (e.g., programmable resistor 460) can be formed from at least one thin-film transistor (TFT). The programmable resistor is disposed in series with the OPD between a supply voltage (VDD) conductor (e.g., VDD BGA pin 470) and a ground conductor (e.g., GND BGA pin 480). Other various aspects will be appreciated from the disclosure herein. Further, in at least some aspects, it will be appreciated that among the various technical advantages the programmable resistor advantageously allows for tuning the impedance of individual devices to reduce the impedance at the resonant frequencies (see, e.g., FIG. 3). This reduces the voltage droop and noise in the power distribution network. Further, by being located in series with the OPD between the VDD and ground, the programmable resistor does not increase the voltage droop (e.g. IR) or power loss in the power supply path supplying the die.

In accordance with other various aspects disclosed herein, the package may be part of an integrated device having a die coupled to the package. Further, the package may be coupled to a printed circuit board (PCB) (see, e.g., FIG. 5D). A power management integrated circuit (PMIC) may be configured to supply power to the integrated device and may also be coupled to the PCB, to provide power to the package and die, as discussed in the foregoing. In the package, the programmable resistor can be formed from a plurality of TFTs, each TFT having a gate coupled to a common gate terminal. The common gate terminal can be coupled a gate power signal to control the resistance of the programmable resistor. The gate power signal can be provided from the PMIC.

In order to fully illustrate the various aspects of the present disclosure, methods of fabrication are presented. It will be appreciated that the illustrated configurations, materials and descriptions are provided merely to aid in the explanation of the various aspects disclosed herein. Additionally, details related to the fabrication are not provided, as they are not necessary for an understanding of the aspects disclosed and would be easily recognized by one skilled in the art. Further, various methods of fabrication are possible, and discussed fabrication methods are presented only to aid in the understanding of the concepts disclosed herein.

Figure 6:
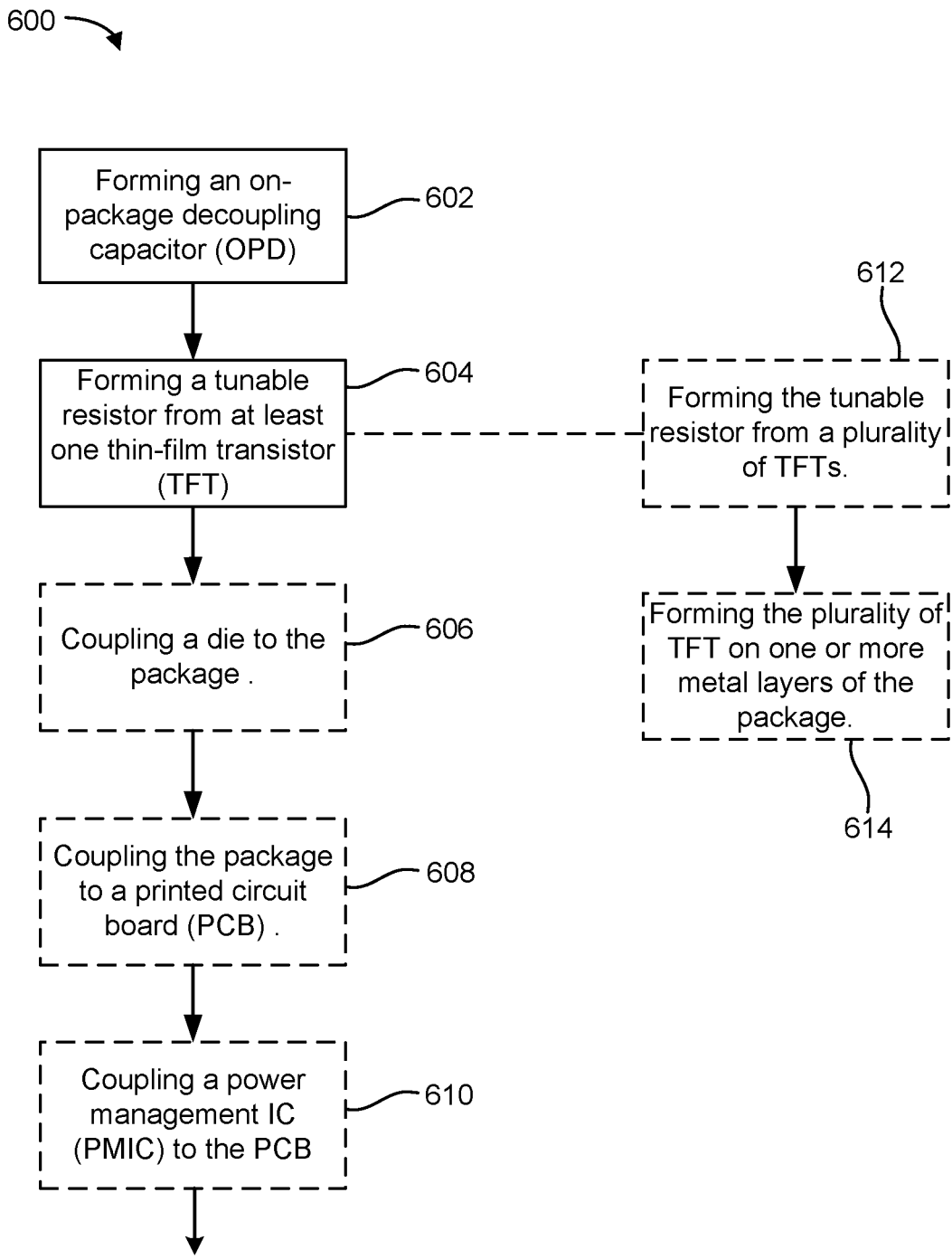
FIG. 6 illustrates a flowchart of a method for manufacturing a package and integrated device in accordance with some examples of the disclosure.

It will be appreciated from the foregoing that there are various methods for fabricating packages and integrated devices, as disclosed herein. FIG. 6 illustrates a flowchart of a method 600 for manufacturing a package in accordance with some examples of the disclosure. As shown in FIG. 6, the method 600 may begin in block 602 with forming an on-package decoupling capacitor (OPD). The method 600 may continue in block 604 with forming a programmable resistor from at least one thin-film transistor (TFT). The programmable resistor is disposed in series with the OPD between a supply voltage (VDD) conductor and a ground conductor. It will be appreciated that additional and optional aspects are also disclosed herein. For example, optionally, at block 612, the method 600 can further include forming the programmable resistor from a plurality of TFTs. The plurality of TFTs may be P-Metal-Oxide-Semiconductor (PMOS) transistors. Further, optionally at block 614, the method 600 may optionally, include forming the plurality of TFTs on one or more metal layers of the package. Additionally, the plurality of TFTs can be formed in a bottom-most metal layer of the package. Further optional aspects can include coupling a die to the package, in 606. In 608, another optional aspect is coupling the package to a printed circuit board. In 610, another optional aspect is coupling a PMIC to the PCB. Accordingly, an integrated device having a power distribution network similar to that shown in FIG. 2 can be formed. It will be appreciated from the foregoing disclosure that additional processes for fabricating the various aspects disclosed herein will be apparent to those skilled in the art and a literal rendition of the processes discussed above will not be provided or illustrated in the included drawings.

The foregoing disclosed devices, methods and functionalities may be designed and configured into computer files (e.g., RTL, GDSII, GERBER, etc.) and stored on computer-readable media. Some or all such files may be provided to fabrication handlers who fabricate the various disclosed devices based on such files. Resulting products may include semiconductor wafers that are then cut into semiconductor die and packaged into a semiconductor chip. The chips may then be employed in devices described herein.

Figure 7:
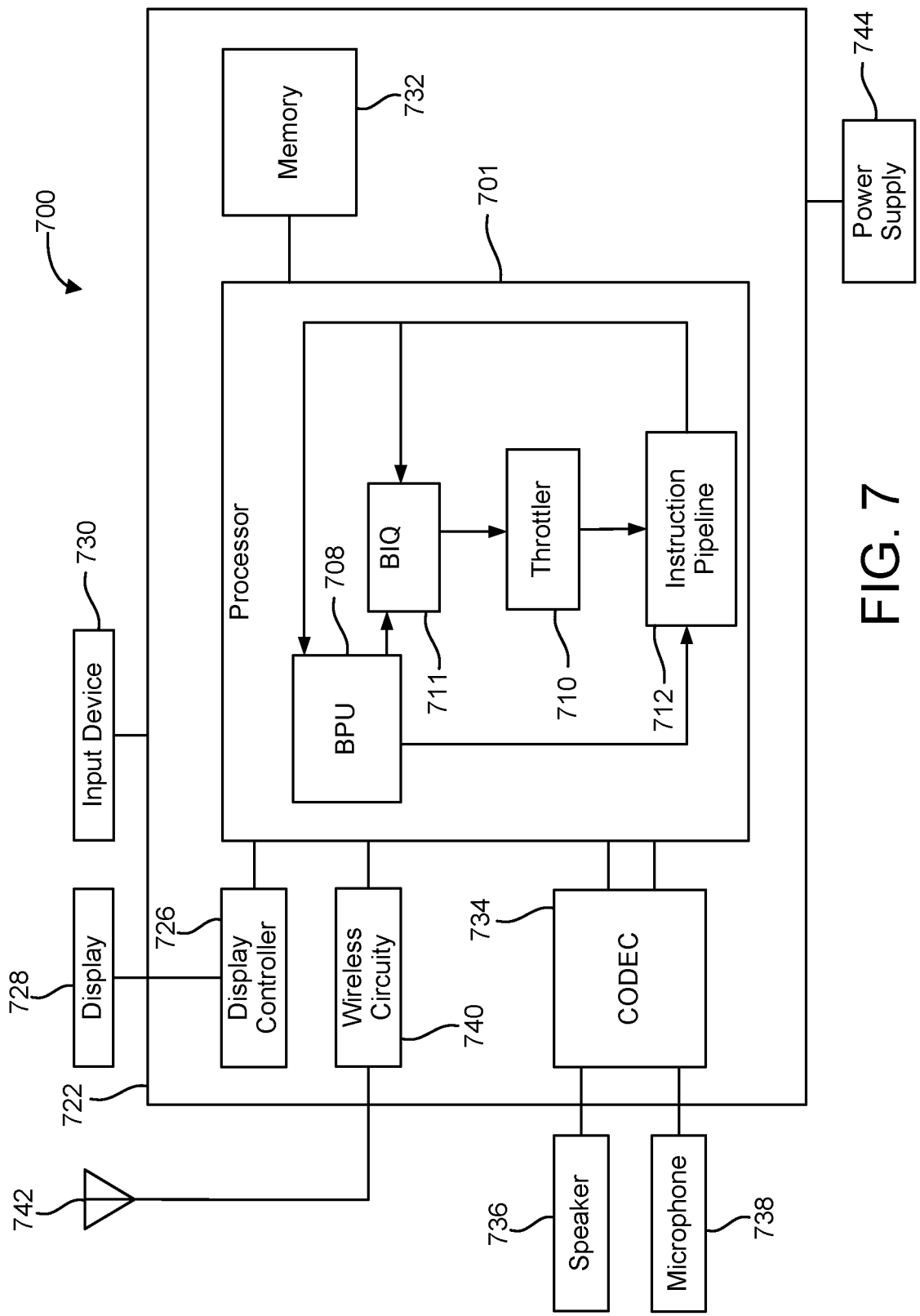
FIG. 7 illustrates an exemplary mobile device in accordance with some examples of the disclosure.

FIG. 7 illustrates an exemplary mobile device in accordance with some examples of the disclosure. Referring now to FIG. 7, a block diagram of a mobile device that is configured according to exemplary aspects is depicted and generally designated mobile device 700. In some aspects, mobile device 700 may be configured as a wireless communication device. As shown, mobile device 700 includes processor 701, which may be configured to implement the methods described herein in some aspects. Processor 701 is shown to comprise instruction pipeline 712, buffer processing unit (BPU) 708, branch instruction queue (BIQ) 711, and throttler 710 as is well known in the art. Other well-known details (e.g., counters, entries, confidence fields, weighted sum, comparator, etc.) of these blocks have been omitted from this view of processor 701 for the sake of clarity. Processor 701 may be communicatively coupled to memory 732 over a link, which may be a die-to-die or chip-to-chip link. Mobile device 700 also includes display 728 and display controller 726, with display controller 726 coupled to processor 701 and to display 728.

In some aspects, FIG. 7 may include coder/decoder (CODEC) 734 (e.g., an audio and/or voice CODEC) coupled to processor 701; speaker 736 and microphone 738 coupled to CODEC 734; and wireless circuitry 740 coupled to wireless antenna 742 and to processor 701.

In a particular aspect, where one or more of the above-mentioned blocks are present, processor 701, display controller 726, memory 732, CODEC 734, and wireless circuitry 740 can be included in a system-in-package or system-on-chip device 722. Input device 730 (e.g., physical or virtual keyboard), power supply 744 (e.g., PMIC), display 728, input device 730, speaker 736, microphone 738, wireless antenna 742, and power supply 744 may be a PMIC, such as discussed in the foregoing, that is integrated with the system-on-chip device 722. The various components disclosed in system-on-chip device 722 may include one or more dies mounted on one or more packages and at least one of the packages may include a programmable resistor and OPD, as disclosed herein.

It should be noted that although FIG. 7 depicts a mobile device 700, processor 701 and memory 732 may also be integrated into a set top box, a music player, a video player, an entertainment unit, a navigation device, a personal digital assistant (PDA), a fixed location data unit, a computer, a laptop, a tablet, a communications device, a mobile phone, or other similar devices.

Figure 8:
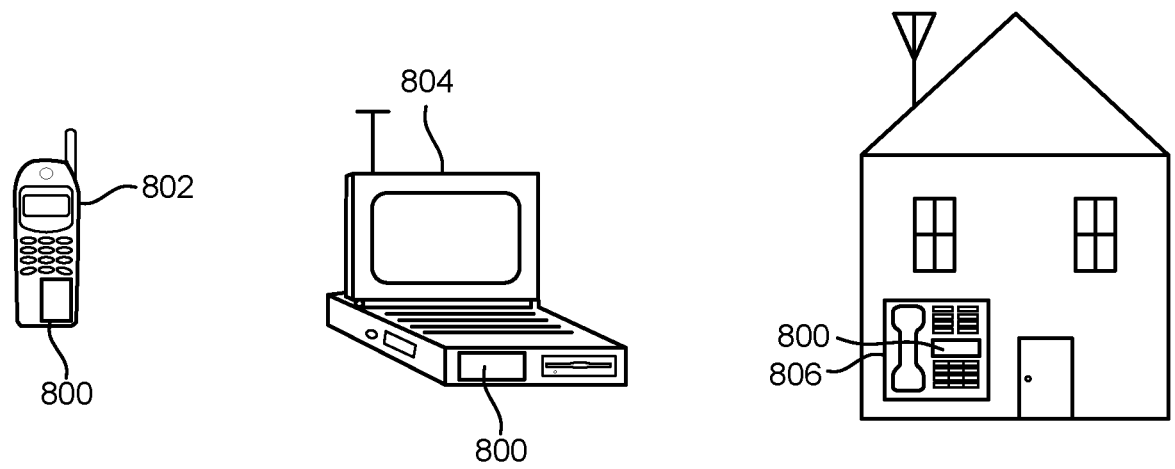
FIG. 8 illustrates various electronic devices that may be integrated with any of the aforementioned integrated device or semiconductor device accordance with various examples of the disclosure.

FIG. 8 illustrates various electronic devices that may be integrated with any of the aforementioned integrated devices or packages in accordance with various examples of the disclosure. For example, a mobile phone device 802, a laptop computer device 804, and a fixed location terminal device 806 may each be considered, generally, user equipment (UE) and may include a semiconductor device 800 as described herein. The semiconductor device 800 may be, for example, any of the integrated circuits, dies, integrated devices, integrated device packages, integrated circuit devices, device packages, integrated circuit (IC) packages, package-on-package devices described herein. The devices 802, 804, 806 illustrated in FIG. 8 are merely exemplary. Other electronic devices may also feature the semiconductor device 800 including, but not limited to, a group of devices (e.g., electronic devices) that includes mobile devices, handheld personal communication systems (PCS) units, portable data units such as personal digital assistants, global positioning system (GPS) enabled devices, navigation devices, set top boxes, music players, video players, entertainment units, fixed location data units such as meter reading equipment, communications devices, smartphones, tablet computers, computers, wearable devices, servers, routers, electronic devices implemented in automotive vehicles (e.g., autonomous vehicles), an Internet of things (IoT) device or any other device that stores or retrieves data or computer instructions or any combination thereof.

It will be appreciated that various aspects disclosed herein can be described as functional equivalents to the structures, materials and/or devices described and/or recognized by those skilled in the art. For example, in one aspect, an apparatus may comprise a means for performing the various functionalities discussed above. It will be appreciated that the aforementioned aspects are merely provided as examples and the various aspects claimed are not limited to the specific references and/or illustrations cited as examples.

One or more of the components, processes, features, and/or functions illustrated in FIGS. 1-8 may be rearranged and/or combined into a single component, process, feature or function or incorporated in several components, processes, or functions. Additional elements, components, processes, and/or functions may also be added without departing from the disclosure. It should also be noted that FIGS. 1-8 and the corresponding description in the present disclosure are not limited to dies and/or ICs. In some implementations, FIGS. 1-8 and the corresponding description may be used to manufacture, create, provide, and/or produce integrated devices. In some implementations, a device may include a die, an integrated device, a die package, an integrated circuit (IC), a device package, an integrated circuit (IC) package, a wafer, a semiconductor device, a package on package (PoP) device, and/or an interposer.

As used herein, the terms "user equipment" (or "UE"), "user device," "user terminal," "client device," "communication device," "wireless device," "wireless communications device," "handheld device," "mobile device," "mobile terminal," "mobile station," "handset," "access terminal," "subscriber device," "subscriber terminal," "subscriber station," "terminal," and variants thereof may interchangeably refer to any suitable mobile or stationary device that can receive wireless communication and/or navigation signals. These terms include, but are not limited to, a music player, a video player, an entertainment unit, a navigation device, a communications device, a smartphone, a personal digital assistant, a fixed location terminal, a tablet computer, a computer, a wearable device, a laptop computer, a server, an automotive device in an automotive vehicle, and/or other types of portable electronic devices typically carried by a person and/or having communication capabilities (e.g., wireless, cellular, infrared, short-range radio, etc.). These terms are also intended to include devices which communicate with another device that can receive wireless communication and/or navigation signals such as by short-range wireless, infrared, wireline connection, or other connection, regardless of whether satellite signal reception, assistance data reception, and/or position-related processing occurs at the device or at the other device. In addition, these terms are intended to include all devices, including wireless and wireline communication devices, that are able to communicate with a core network via a radio access network (RAN), and through the core network the UEs can be connected with external networks such as the Internet and with other UEs. Of course, other mechanisms of connecting to the core network and/or the Internet are also possible for the UEs, such as over a wired access network, a wireless local area network (WLAN) (e.g., based on IEEE 802.11, etc.) and so on. UEs can be embodied by any of a number of types of devices including but not limited to printed circuit (PC) cards, compact flash devices, external or internal modems, wireless or wireline phones, smartphones, tablets, tracking devices, asset tags, and so on. A communication link through which UEs can send signals to a RAN is called an uplink channel (e.g., a reverse traffic channel, a reverse control channel, an access channel, etc.). A communication link through which the RAN can send signals to UEs is called a downlink or forward link channel (e.g., a paging channel, a control channel, a broadcast channel, a forward traffic channel, etc.). As used herein the term traffic channel (TCH) can refer to either an uplink/reverse or downlink/forward traffic channel.

The wireless communication between electronic devices can be based on different technologies, such as code division multiple access (CDMA), W-CDMA, time division multiple access (TDMA), frequency division multiple access (FDMA), Orthogonal Frequency Division Multiplexing (OFDM), Global System for Mobile Communications (GSM), 3GPP Long Term Evolution (LTE), 5G New Radio, Bluetooth (BT), Bluetooth Low Energy (BLE), IEEE 802.11 (WiFi), and IEEE 802.15.4 (Zigbee/Thread) or other protocols that may be used in a wireless communications network or a data communications network. Bluetooth Low Energy (also known as Bluetooth LE, BLE, and Bluetooth Smart) is a wireless personal area network technology designed and marketed by the Bluetooth Special Interest Group intended to provide considerably reduced power consumption and cost while maintaining a similar communication range. BLE was merged into the main Bluetooth standard in 2010 with the adoption of the Bluetooth Core Specification Version 4.0 and updated in Bluetooth 5.

The word "exemplary" is used herein to mean "serving as an example, instance, or illustration." Any details described herein as "exemplary" is not to be construed as advantageous over other examples. Likewise, the term "examples" does not mean that all examples include the discussed feature, advantage or mode of operation. Furthermore, a particular feature and/or structure can be combined with one or more other features and/or structures. Moreover, at least a portion of the apparatus described hereby can be configured to perform at least a portion of a method described hereby.

It should be noted that the terms "connected", "coupled," or any variant thereof, mean any connection or coupling, either direct or indirect, between elements, and can encompass a presence of an intermediate element between two elements that are "connected" or "coupled" together via the intermediate element.

Any reference herein to an element using a designation such as "first", "second," and so forth does not limit the quantity and/or order of those elements. Rather, these designations are used as a convenient method of distinguishing between two or more elements and/or instances of an element. Also, unless stated otherwise, a set of elements can comprise one or more elements.

Those skilled in the art will appreciate that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Nothing stated or illustrated depicted in this application is intended to dedicate any component, action, feature, benefit, advantage, or equivalent to the public, regardless of whether the component, action, feature, benefit, advantage, or the equivalent is recited in the claims.

Further, those of skill in the art will appreciate that the various illustrative logical blocks, modules, circuits, and algorithm actions described in connection with the examples disclosed herein may be implemented as electronic hardware, computer software, or combinations of both. To clearly illustrate this interchangeability of hardware and software, various illustrative components, blocks, modules, circuits, and actions have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

Although some aspects have been described in connection with a device, it goes without saying that these aspects also constitute a description of the corresponding method, and so a block or a component of a device should also be understood as having a corresponding method action or as a feature of a method action. Analogously thereto, aspects described in connection with or as a method action also constitute a description of a corresponding block or detail or feature of a corresponding device. Some or all of the method actions can be performed by a hardware apparatus (or using a hardware apparatus), such as, for example, a microprocessor, a programmable computer or an electronic circuit. In some examples, some or a plurality of the method actions can be performed by such apparatus.

In the detailed description above it can be seen that different features are grouped together in examples. This manner of disclosure should not be understood as an intention that the claimed examples have more features than are explicitly mentioned in the respective claim. Rather, the disclosure may include fewer than all features of an individual example disclosed. Therefore, the following claims should hereby be deemed to be incorporated in the description, wherein each claim by itself can stand as a separate example. Although each claim by itself can stand as a separate example, it should be noted that—although a dependent claim can refer in the claims to a specific combination with one or a plurality of claims—other examples can also encompass or include a combination of said dependent claim with the subject matter of any other dependent claim or a combination of any feature with other dependent and independent claims. Such combinations are proposed herein, unless it is explicitly expressed that a specific combination is not intended. Furthermore, it is also intended that features of a claim can be included in any other independent claim, even if said claim is not directly dependent on the independent claim.

It should furthermore be noted that methods, systems, and apparatus disclosed in the description or in the claims can be implemented by a device comprising means for performing the respective actions of this method.

Furthermore, in some examples, an individual action can be subdivided into a plurality of sub-actions or contain a plurality of sub-actions. Such sub-actions can be contained in the disclosure of the individual action and be part of the disclosure of the individual action.

While the foregoing disclosure shows illustrative examples of the disclosure, it should be noted that various changes and modifications could be made herein without departing from the scope of the disclosure as defined by the appended claims. The functions and/or actions of the method claims in accordance with the examples of the disclosure described herein need not be performed in any particular order. Additionally, well-known elements will not be described in detail or may be omitted so as to not obscure the relevant details of the aspects and examples disclosed herein. Furthermore, although elements of the disclosure may be described or claimed in the singular, the plural is contemplated unless limitation to the singular is explicitly stated.

In the following further examples are described to facilitate the understanding of the invention.

In a first further example, a package is described, the package comprising an on-package decoupling capacitor (OPD) and a programmable resistor formed from at least one thin-film transistor (TFT), wherein the programmable resistor is disposed in series with the OPD between a supply voltage (VDD) conductor and a ground conductor. The programmable resistor may be formed from a plurality of TFTs. The plurality of TFTs may be P-Metal-Oxide-Semiconductor (PMOS) transistors. The plurality of PMOS transistors may be located on one or more metal layers of the package. The plurality of PMOS transistors may be located in a bottom-most metal layer. Source terminals (S) of the plurality of PMOS transistors may be coupled to the VDD conductor and drain terminals (D) of the plurality of PMOS transistors may be coupled to a VDD pad of the OPD. Source terminals (S) of the plurality of PMOS transistors may be coupled to a ground pad of the OPD and drain terminals (D) of the plurality of PMOS transistors may be coupled to a ground conductor. The plurality of PMOS transistors may have an associated plurality of gates coupled to a common gate terminal. The common gate terminal may be configured to be coupled to a gate power signal to control the resistance of the programmable resistor. The gate power signal may be provided from a power management integrated circuit (PMIC) that also provides power to the package. The plurality of TFTs may be N-Metal-Oxide-Semiconductor (NMOS) transistors. The plurality of NMOS transistors may be located on one or more metal layers of the package. The plurality of NMOS transistors may be located in a bottom-most metal layer. The package may be a wafer-level package. The at least one TFT may be located in a bottom-most metal layer and formed using a same metal as the bottom-most metal layer. The package may be an integrated fan-out (InFO) wafer-level package. Further, the package may be incorporated into an apparatus, wherein the apparatus may be at least one of a music player, a video player, an entertainment unit, a navigation device, a communications device, a mobile device, a mobile phone, a smartphone, a personal digital assistant, a fixed location terminal, a tablet computer, a computer, a wearable device, an Internet of things (IoT) device, a laptop computer, a server, or a device in an automotive vehicle.

In yet another further example, an integrated device is described, the integrated device comprising a die and a package coupled to the die, wherein the package comprises an on-package decoupling capacitor (OPD) and a programmable resistor formed from at least one thin-film transistor (TFT), wherein the programmable resistor is disposed in series with the OPD between a supply voltage (VDD) conductor and a ground conductor. The integrated device may further comprise a power supply to provide power to the integrated device and a printed circuit board (PCB), wherein the power supply and the package may be both coupled to the PCB. The programmable resistor may be formed from a plurality of TFTs, each having a gate coupled to a common gate terminal. The common gate terminal may be configured to be coupled to a gate power signal to control the resistance of the programmable resistor. The power supply may be power management integrated circuit (PMIC). The gate power signal may be provided from the PMIC. The integrated device may be incorporated into an apparatus, wherein the apparatus may be at least one of a music player, a video player, an entertainment unit, a navigation device, a communications device, a mobile device, a mobile phone, a smartphone, a personal digital assistant, a fixed location terminal, a tablet computer, a computer, a wearable device, an Internet of things (IoT) device, a laptop computer, a server, or a device in an automotive vehicle.

In yet another further example, a method for manufacturing a package is described, the method comprising forming an on-package decoupling capacitor (OPD) and forming a programmable resistor from at least one thin-film transistor (TFT), wherein the programmable resistor is disposed in series with the OPD between a supply voltage (VDD) conductor and a ground conductor. Forming the programmable resistor may comprise forming the programmable resistor from a plurality of TFTs. The plurality of TFTs may be P-Metal-Oxide-Semiconductor (PMOS) transistors. Forming the programmable resistor may comprise forming the plurality of PMOS transistors on one or more metal layers of the package. The plurality of PMOS transistors may be formed in a bottom-most metal layer of the package. Source terminals (S) of the plurality of PMOS transistors may be coupled to the VDD conductor and drain terminals (D) of the plurality of PMOS transistors may be coupled to a VDD pad of the OPD.

What is claimed is:

1. A package comprising:
an on-package decoupling capacitor (OPD); and
a programmable resistor formed from at least one thin-film transistor (TFT),
wherein the programmable resistor is disposed in series with the OPD between a supply voltage (VDD) conductor and a ground conductor, and wherein the programmable resistor is disposed to receive a control signal for controlling a resistance of the programmable resistor from a power management integrated circuit (PMIC) configured to provide power to the package.

2. The package of claim 1, wherein the programmable resistor is formed from a plurality of TFTs.

3. The package of claim 2, wherein the plurality of TFTs are P-Metal-Oxide-Semiconductor (PMOS) transistors.

4. The package of claim 3, wherein the plurality of PMOS transistors are located on one or more metal layers of the package.

5. The package of claim 4, wherein the plurality of PMOS transistors are located in a bottom-most metal layer.

6. The package of claim 3, wherein source terminals (S) of the plurality of PMOS transistors are coupled to the VDD conductor and drain terminals (D) of the plurality of PMOS transistors are coupled to a VDD pad of the OPD.

7. The package of claim 3, wherein source terminals (S) of the plurality of PMOS transistors are coupled to a ground pad of the OPD and drain terminals (D) of the plurality of PMOS transistors are coupled to a ground conductor.

8. The package of claim 3, wherein the plurality of PMOS transistors have an associated plurality of gates coupled to a common gate terminal.

9. The package of claim 8, wherein the common gate terminal is configured to be coupled to the control signal to control the resistance of the programmable resistor.

10. The package of claim 2, wherein the plurality of TFTs are N-Metal-Oxide-Semiconductor (NMOS) transistors.

11. The package of claim 10, wherein the plurality of NMOS transistors are located on one or more metal layers of the package.

12. The package of claim 11, wherein the plurality of NMOS transistors are located in a bottom-most metal layer.

13. The package of claim 1, wherein the package is a wafer-level package.

14. The package of claim 13, wherein the at least one TFT is located in a bottom-most metal layer and formed using a same metal as the bottom-most metal layer.

15. The package of claim 13, wherein the package is an integrated fan-out (InFO) wafer-level package.

16. The package of claim 1, wherein the package is incorporated into an apparatus, wherein the apparatus is at least one of a music player, a video player, an entertainment unit, a navigation device, a communications device, a mobile device, a mobile phone, a smartphone, a personal digital assistant, a fixed location terminal, a tablet computer, a computer, a wearable device, an Internet of things (IoT) device, a laptop computer, a server, or a device in an automotive vehicle.

17. An integrated device comprising:
a die; and
a package coupled to the die, wherein the package comprises:
an on-package decoupling capacitor (OPD); and a programmable resistor formed from at least one thin-film transistor (TFT),
wherein the programmable resistor is disposed in series with the OPD between a supply voltage (VDD) conductor and a ground conductor, and wherein the programmable resistor is disposed to receive a control signal for controlling a resistance of the programmable resistor from a power management integrated circuit (PMIC) configured to provide power to the package.

18. The integrated device of claim 17, further comprising:
a printed circuit board (PCB), wherein the PMIC and the package are both coupled to the PCB.

19. The integrated device of claim 18, wherein the programmable resistor is formed from a plurality of TFTs, each having a gate coupled to a common gate terminal.

20. The integrated device of claim 19, wherein the common gate terminal is configured to be coupled to the control signal to control the resistance of the programmable resistor.

21. The integrated device of claim 17, wherein the integrated device is incorporated into an apparatus, wherein the apparatus is at least one of a music player, a video player, an entertainment unit, a navigation device, a communications device, a mobile device, a mobile phone, a smartphone, a personal digital assistant, a fixed location terminal, a tablet computer, a computer, a wearable device, an Internet of things (IoT) device, a laptop computer, a server, or a device in an automotive vehicle.

22. A method for manufacturing a package, the method comprising:
forming an on-package decoupling capacitor (OPD); and
forming a programmable resistor from at least one thin-film transistor (TFT),
wherein the programmable resistor is disposed in series with the OPD between a supply voltage (VDD) conductor and a ground conductor, and wherein the programmable resistor is disposed to receive a control signal for controlling a resistance of the programmable resistor from a power management integrated circuit (PMIC) configured to provide power to the package.

23. The method of claim 22, wherein forming the programmable resistor comprises:
forming the programmable resistor from a plurality of TFTs.

24. The method of claim 23, wherein the plurality of TFTs are P-Metal-Oxide-Semiconductor (PMOS) transistors.

25. The method of claim 24, wherein forming the programmable resistor comprises:
forming the plurality of PMOS transistors on one or more metal layers of the package.

26. The method of claim 25, wherein the plurality of PMOS transistors are formed in a bottom-most metal layer of the package.

27. The method of claim 24, wherein source terminals (S) of the plurality of PMOS transistors are coupled to the VDD conductor and drain terminals (D) of the plurality of PMOS transistors are coupled to a VDD pad of the OPD.

28. A package comprising:
an on-package decoupling capacitor (OPD); and
a programmable resistor formed from a plurality of P-Metal-Oxide-Semiconductor (PMOS) thin-film transistors (TFTs), wherein source terminals (S) of the plurality of PMOS transistors are coupled to a ground pad of the OPD and drain terminals (D) of the plurality of PMOS transistors are coupled to a ground conductor, wherein the programmable resistor is disposed in series with the OPD between a supply voltage (VDD) conductor and a ground conductor.

* * * * *